United States Patent
Ma (12)

(10) Patent No.: US 7,708,583 B2
(45) Date of Patent: May 4, 2010

(54) ELECTRICAL CONNECTOR ASSEMBLY WITH HEAT DISSIPATING DEVICE

(75) Inventor: Hao-Yun Ma, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/315,250

(22) Filed: Dec. 1, 2008

(65) Prior Publication Data

US 2009/0142956 A1   Jun. 4, 2009

(30) Foreign Application Priority Data

Nov. 29, 2007   (CN)  ......................... 2007 2 0041766

(51) Int. Cl.
*H01R 13/00*   (2006.01)
(52) U.S. Cl. ...................... 439/485; 361/711
(58) Field of Classification Search ............... 439/485, 439/486, 487; 361/711, 702
See application file for complete search history.

(56) References Cited

U.S. PATENT DOCUMENTS

| 5,722,848 | A | 3/1998 | Lai et al. |
| 7,001,197 | B2 | 2/2006 | Shirai et al. |
| 7,388,747 | B2 * | 6/2008 | Yang et al. ................. 361/700 |
| 2008/0291638 | A1 * | 11/2008 | Ma et al. ................... 361/719 |
| 2009/0101318 | A1 * | 4/2009 | Ma ....................... 165/104.33 |

* cited by examiner

*Primary Examiner*—Hae Moon Hyeon
(74) *Attorney, Agent, or Firm*—Andrew C. Cheng; Wei Te Chung; Ming Chieh Chang

(57) ABSTRACT

An electrical connector assembly includes an electrical connector and a heat dissipate device disposed upon the electrical connector. The heat dissipate device includes a heat plate, a heat pipe secured on the heat plate and a load plate located between the heat plate and the heat pipe. The load plate has retention sections engaging with the heat plate for positioning the heat plate on the load plate in three directions.

20 Claims, 6 Drawing Sheets

ELECTRICAL CONNECTOR ASSEMBLY WITH HEAT DISSIPATING DEVICE

BACKGROUND OF THE INVENTION

1. Field of the Invention

The present invention relates to a heat dissipating device, and more particularly to a heat dissipating device for use with a socket connector. The heat dissipating includes a heat spread on which a heat pipe is thermally mounted, and a load plate pushing the heat spread toward an IC (Integrated Circuit) on which the heat spread is seated.

2. Description of the Prior Art

U.S. Pat. No. 5,722,848 issued to Lai on Mar. 3, 1998 discloses a typical connector socket, and which is generally referred to as a ZIF (Zero Insertion Force) socket. In general, the socket includes a base with a plurality of contacts assembled therein, and a cover moveably attached to the base. A lever with a cam mechanism is arranged between the base and cover to drive the cover from a first position to a second position. When the lever is located in a vertical position, the cover is located at the first position, in which a hole in the cover is completely in aligned with a corresponding passageway in the base. In this position, pins of the electrical package can be inserted from the cover into the passageway without any engagement with the contact. When the electrical package is properly seated on the cover, then the lever is moved from the vertical position to a horizontal position, and simultaneously driving the cover from the first position to the second position. During this process, the pins of the electrical package are then in contact with the contact within the base. The Lai '848 is specially directed to a desk-top computer.

CPU (Central Process Unit) socket used on notebook is substantially similar to what is used on the desktop computer, and the only difference is on the lever used on '848 patent was replaced by a screw with a cam mechanism. When the screw is driven or rotated, the cover is driven to move along the base, therefore the pins of the electrical package are then in contact with the contact within the base, and no detailed description is given here.

U.S. Pat. No. 7,001,197 issued to Shirai on Feb. 21, 2006 discloses another type of socket, and which can be generally called LGA (Land Grid Array) socket. The original pins type of chip occupies more space on the bottom surface of the electrical package. In order to increase input/output speed, conductive pads are introduced to replace the pins so as to directly and electrically contact with contact terminals within the socket. No doubt, the speed is increased.

As clearly shown in Figures of Shirai '197, it is different configuration from to what Lai '848 discloses. The socket generally includes a metal stiffener with a housing securely supported therein. Then a metal clip is pivotally assembled to the stiffener. On the other hand, the clip is pivotally assembled to one side of the stiffener and when the clip is closed to the stiffener, the lever has a cam which can lock the clip to a closed position. By this arrangement, the electrical package is seated on the housing before the clip is closed, and then the clip will tightly press the electrical package toward the housing for ensuring proper electrical connection therebetween.

Shirai '197 can be applied to the desktop computer for which has more room for the operation of the lever, while it is almost impossible to apply Shirai '197 directly to the notebook in view of its compact, and thin space.

Another factor to be considered is the configuration of the electrical package. The electrical package generally includes a substrate and a die mounted upon the substrate. Even the electrical package is rigid, it is still vulnerable to deform or warp for downward force applied thereon is not evenly distributed. In Shirai '197 patent, the die is not pressed by the clip which has a window for it. The die is in direct contact with a heat sink. As a result, when applying the so-called LGA socket to notebook, how to provide a mechanism functionally similar to Shirai '197, while keep downward force evenly distributes to both die and substrate, is a motive for the present invention.

The configuration of heat sink is another factor to be considered. Typically, the heat sink device includes a bottom plate and a plurality of parallel heat sink clip disposed on the bottom plate. As the heat sink device generally has a big volume, it applied to the desktop computer is ok, while it is almost impossible to apply to the notebook in view of its compact and thin space.

FIG. 1 and FIG. 2 disclose an electrical connector assembly related to the present invention and comprising an electrical connector 12 for electrical connecting with an electrical package 11 to the printed circuit board 13, and a heat dissipate device mounted on the electrical package 11. The dissipate device includes a heat plate 14 close to the electrical package 11, a load plate 15 pressing edges 142 of the heat plate 14, and a heat pipe 16 contacting with the heat plate 14. The heat plate 14 has a rectangular configuration and includes a protruding portion 141 and edges 142. The load plate has a pair of longitudinal edge 151, a pair of transverse edge 152, and an opening (not labeled) formed therebetween.

In assembly, the electrical connector 12 is first attached to the PCB (Printed Circuit Board) 13 and the electrical package 11 is inserted into the connector 12. The heat pipe 16 is soldered to the heat plate 14. Put the heat plate 14 into the opening of the load plate 15 whereby longitudinal edges of the heat plate 14 is paralleled to the longitudinal edges 151 of the load plate 15 and the heat pipe 16 is supported by the load plate 15. Then, rotate the heat plate 14 and the heat pipe 16 so that the longitudinal edges of the heat plate 14 are parallel to the transverse edges 152 of the load plate 15 and the edges 142 are pressed by the load plate 15. Therefore, the load plate 15 is sandwiched by the heat pipe 16 and the heat plate 14. Finally, the load plate 15, heat pipe 16 and the heat plate 14 are mounted to the electrical package 11 and the PCB 13 simultaneously. It is can be seen that the assembly process of this type of connector is complicated.

Therefore, there is need to supply an improved electrical connector assembly with a heat dissipating device.

SUMMARY OF THE INVENTION

Accordingly, an object of the present invention is to provide an electrical connector assembly with a heat dissipate device which can simplify the assembly process.

In order to achieve the object set forth, an electrical connector assembly comprising an electrical connector and a heat dissipate device disposed upon the electrical connector. The heat dissipate device comprises a heat plate, a heat pipe secured on the heat plate and a load plate located between the heat plate and the heat pipe. The load plate includes retention sections engaging with the heat plate and snugly holding the heat plate within the load plate.

DESCRIPTION OF PREFERRED EMBODIMENT

Reference will now be made to the drawings to describe the present invention in detail.

Figure 1:
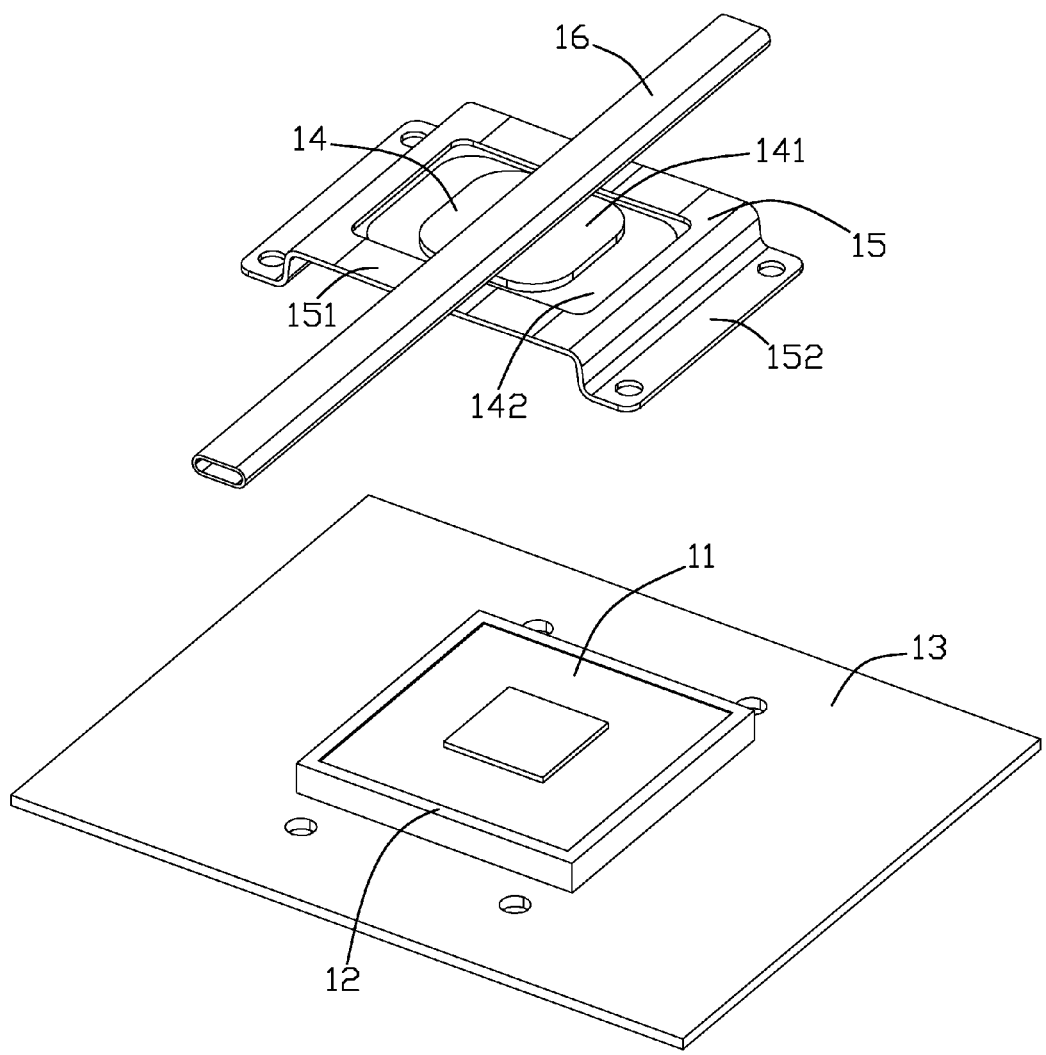
FIG. 1 is an exploded view of a related electrical connector assembly, showing the heat dissipate device not mounting to the PCB.
Figure 2:
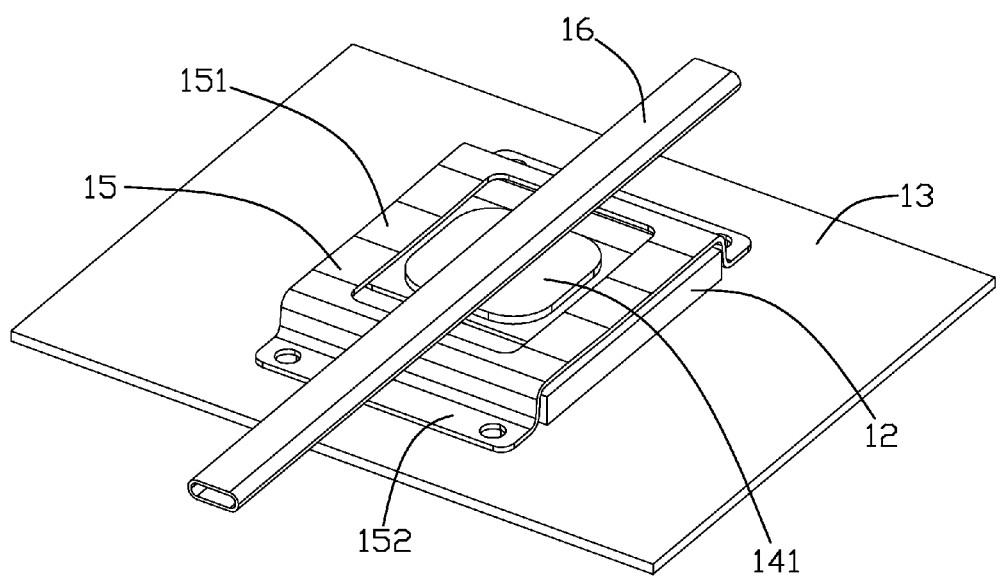
FIG. 2 is an assemble view of the electrical connector assembly shown in FIG. 1, showing the heat dissipate device having mounted to the PCB.
Figure 3:
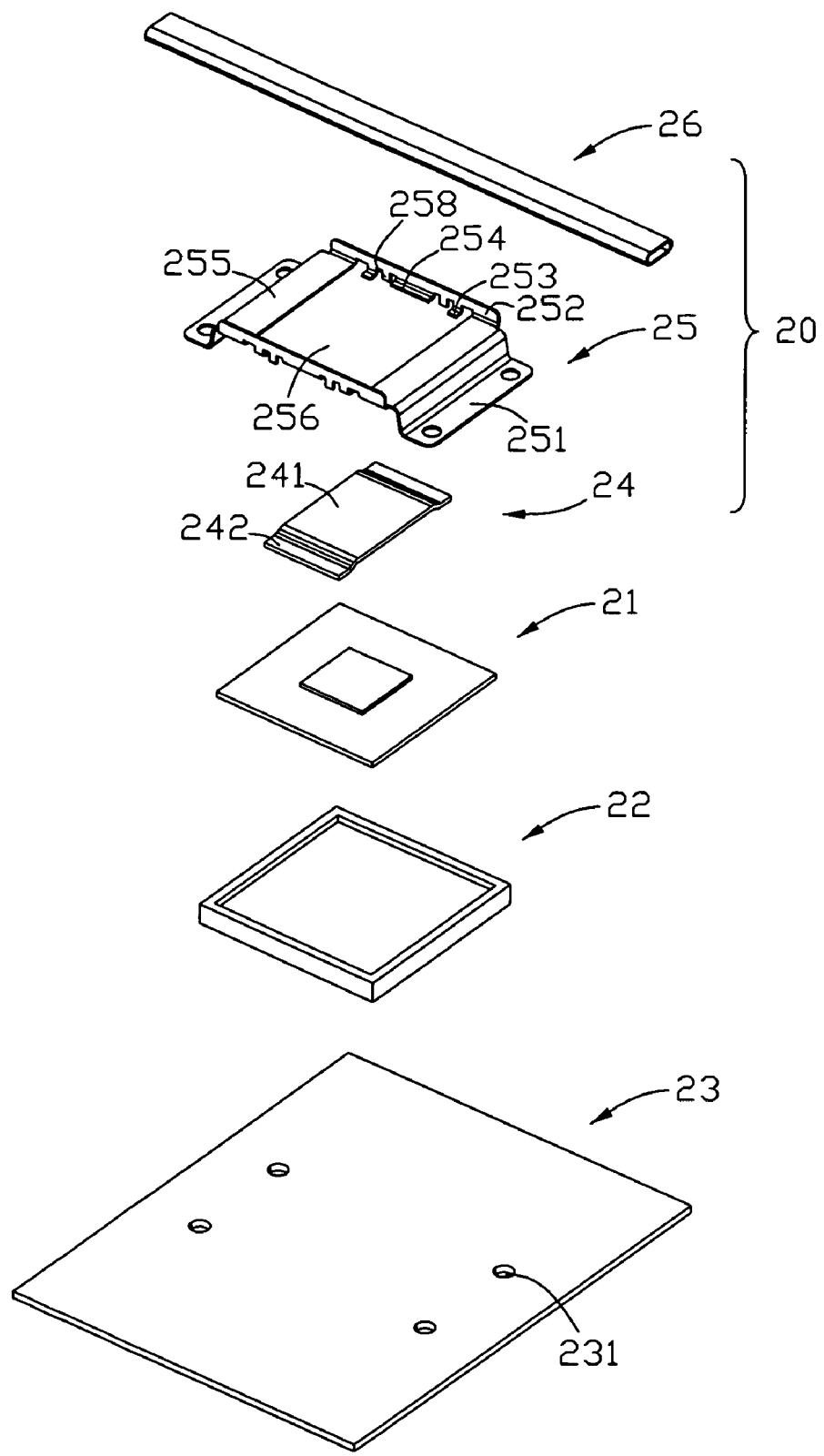
FIG. 3 is an exploded view of the electrical connector assembly of a preferred embodiment according to the present invention.

Referring to FIG. 3, an electrical connector assembly of the present invention comprises an electrical connector 22 for establishing electrical connection between a printed circuit board (PCB) 23 and an electrical package 21, and a heat dissipating device 20 disposed on the electrical connector 22. The electrical connector 22 comprises an insulative housing and a plurality of electrical contacts (not shown) for electrically connecting with the PCB 23 and the electrical package 21. The heat dissipating device 20 comprises a heat plate 24 close to the electrical package 21, a load plate 25 for securing the heat plate 24, and a heat pipe 26 soldering on the heat plate 24.

The heat plate 24 is made of metal plate and comprises a plate portion 241 and a pair of wing portions 242 bending downwardly from opposite sides of the plate portion 241.

Figure 4:
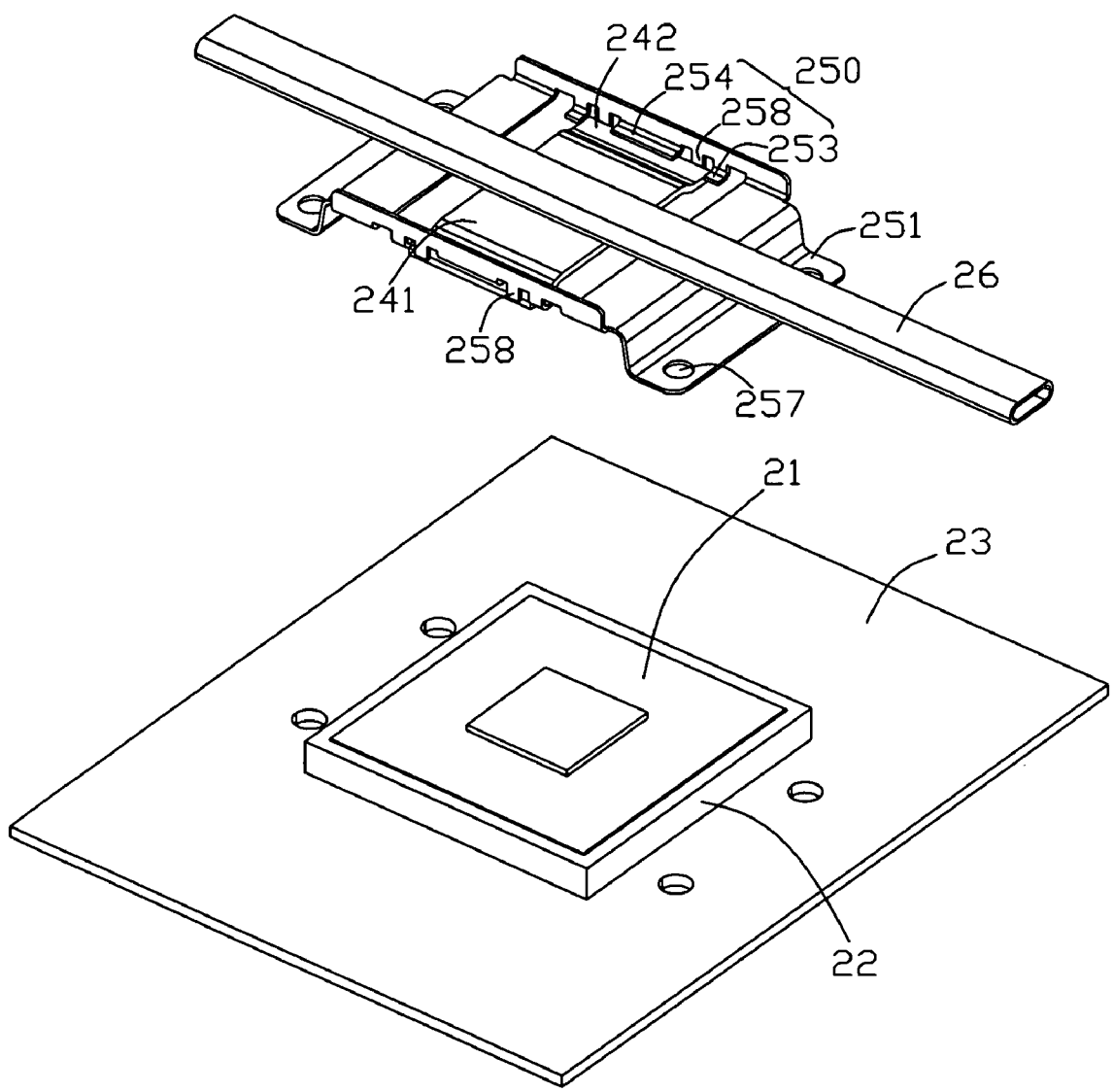
FIG. 4 is an exploded view of the electrical connector assembly shown in FIG. 3, showing the heat dissipate device not mounting to the PCB.
Figure 5:
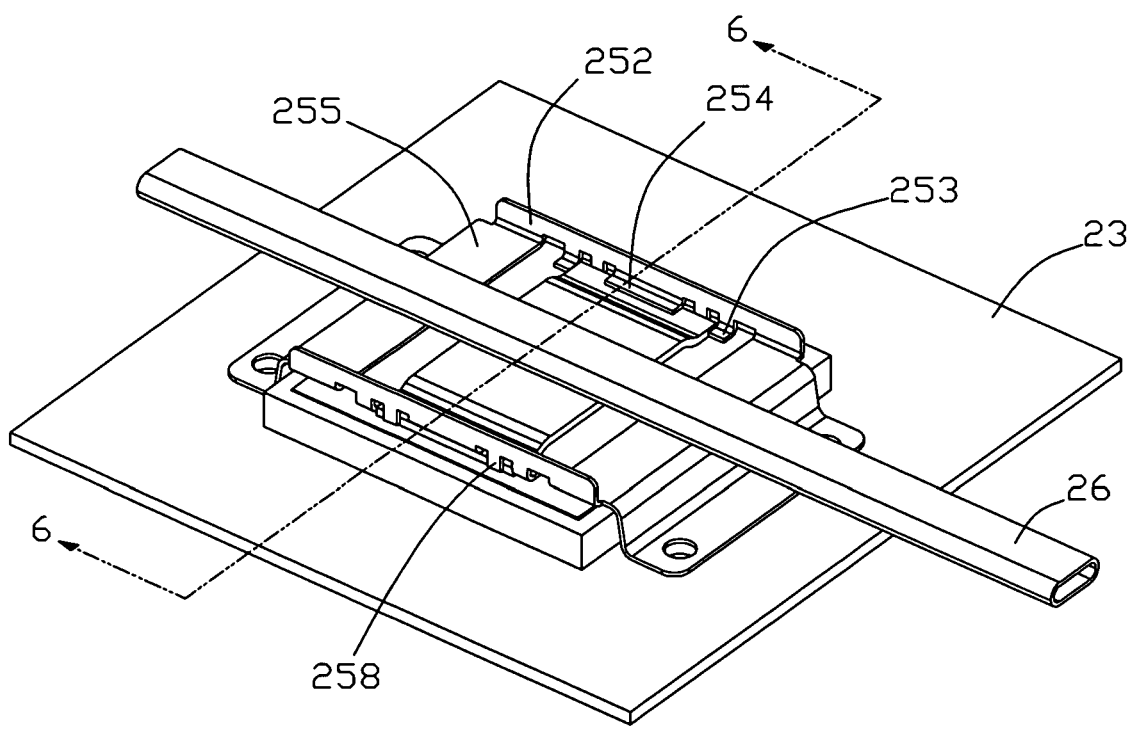
FIG. 5 is an assemble view of the electrical connector assembly shown in FIG. 3, showing the heat dissipate device having mounted to the PCB.
Figure 6:
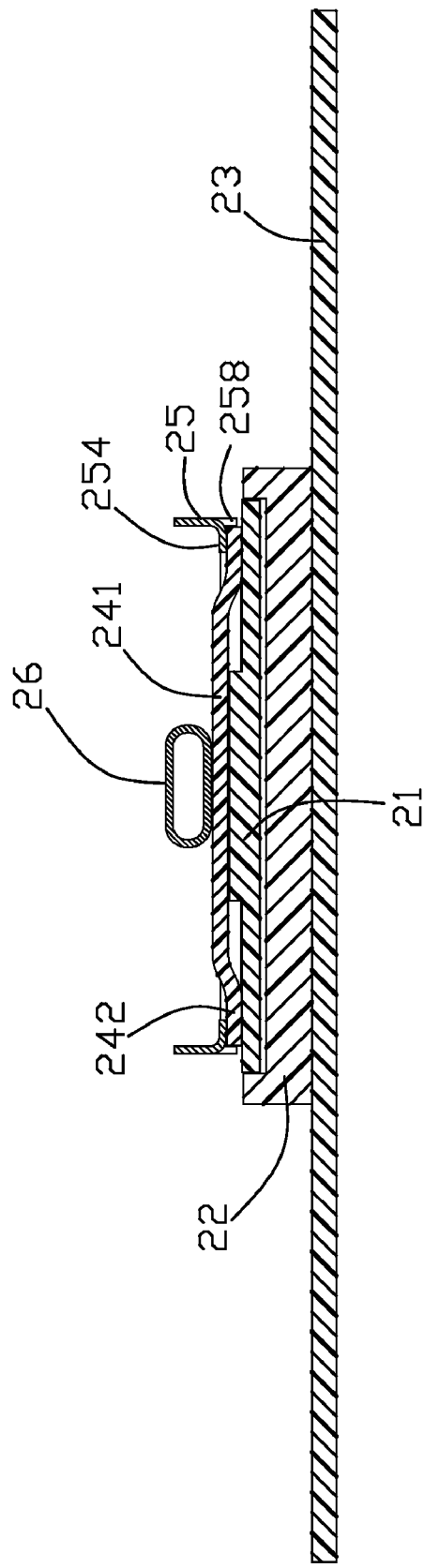
FIG. 6 is a sectional view taken along line 4-4 of FIG. 5.

Please referring FIGS. 4 to 6, the load plate 25 is used for pressing the electrical package 21 toward the electrical connector 22, and made of metal material or other material, in the present embodiment, the load plate 25 is made of metal material. The load plate 25 is substantially rectangular configuration and comprises a plate portion 255 and a pair of wing portions 251 at opposite sides of the plate portion 255. The plate portion 255 defines a pair of longitudinal edges, a pair of transverse edges, and an opening 256 formed between the edges. The wing portions 251 are bending downwardly from the transverse edges of the plate portion 255, respectively and each defines a pair of holes 257 thereon. The printed circuit board 23 defines two pair of holes 231 accordingly for securing the load plate 25 thereon.

The plate portion 255 also includes a pair of spring sidewalls 252 extending upwardly from the longitudinal edges thereof with retention section 250 thereon. The retention section 250 includes first tabs 253, second tabs 254 and third tabs 258. The first and second tabs 254 bend inwardly from the sidewalls 252 and the first tabs 253 is lower than the second tabs 254. The third tabs 258 are formed by part of the sidewalls 252 and disposed at outer side of the heat plate 24 thereby the movement of the load plate are also limited in the front to back direction.

When assemble heat dissipate device, firstly solder the hear pipe 26 to the heat plate 24. Then pull the sidewalls 252 outwardly so that the heat plate 24 can attach thereon in a proper position. At this time, the wing portions 242 of the heat plate 24 are pressed by the second tabs 254 for limiting the upward movement of the heat plate 24. Since the heat pipe 26 is supported on the plate portion 255 of the load plate 25, the downward movement of the heat plate 24 is also restricted. The first tabs 253 are located at opposite sides of the heat plate 24 and in a same level with the heat plate 24. Therefore, the first tabs 253 can abut against the heat plate 24 for preventing the movement thereof in the left to right direction. Furthermore, the third tabs 258 are formed by part of the sidewall 252 and disposed at outer side of the heat plate 24 thereby positioning the heat plate 24 on the load plate 25 in the front to back direction.

In assembly, the electrical connector 22 is firstly mounted to the printed circuit board 23. The electrical package 21 is inserted into the electrical connector 22. Then the heat dissipate device 20 is attached to the electrical package 21 and the printed circuit board 23. The load plate 25 is secured to the printed circuit board 23 by fasten elements (not shown) extending through the holes 231, 257. The electrical package 21 includes a lower periphery section and a raised center section. The plate portion 241 of the heat plate 24 contacts with the raised center section of the electrical package 21 and the wing portions 242 presses the lower periphery section of the electrical package 21. Heat generated by the electrical package can be transmitted through the heat plate 24 and the heat pipe 26. The heat plate 24 also could contact with only one of the raised center section and said lower periphery section of the electronic package 21. In a final assembled stage, the heat plate 24 and the load plate 25 are vertically engaged with each other on a periphery area in an overlapped manner under condition of the heat pipe 26 and the heat plate 24 cooperating with each other to essentially vertically sandwich the load plate 25 therebetween with a sequence of the heat plate 24, the load plate 25 and the heat pipe 26 from bottom to top for preventing the pre-assembled heat plate 24 and heat pipe 26 from being withdrawn from the load plate 25. The heat plate 24 also could be recoverably deflectable about said periphery area to change said overlapped manner to a non-overlapped manner so as to allow the heat plate 24 with the preassembled heat pipe 26 to be successively assembled with the load plate 25 without interference for reaching said final assembled stage.

Although the heat plate and the heat pipe are secured to each other by soldering in the preferred embodiment, they also could attach to each other by other mechanical structures. The load plate 25 has flexibility so that the heat plate 24 can be mounted thereon during elastic deformation and positioned thereon when the load plate 25 return to original form.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly comprising:
   an electrical connector; and
   a heat dissipate device disposed upon the electrical connector and comprising a heat plate, a heat pipe secured on the heat plate and a load plate located between the heat plate and the heat pipe, the heat plate comprising a plate portion and a pair of wing portions bending downwardly from the plate portion; wherein
   the load plate includes retention sections engaging with the heat plate and snugly holding the heat plate within the load plate.

2. The electrical connector assembly as claimed in claim 1, wherein heat pipe is soldered on the plate portion of the heat plate and the heat pipe is supported on the load plate.

3. The electrical connector assembly as claimed in claim 1, wherein load plate comprises a plate portion, a pair of wing portion bending downwardly from opposite sides thereof, and an opening on the plate portion for accommodating the heat plate.

4. The electrical connector assembly as claimed in claim 3, wherein the load plate includes a pair of sidewalls extending upwardly from the plate portion and said retention sections are formed on the sidewalls.

5. The electrical connector assembly as claimed in claim 4, wherein the retention section includes first and second tabs bending inwardly from the sidewall, and wherein the first tabs are located at one pair of sides of the heat plate for positioning the heat plate in a first direction and the second tables are located upon the heat plate for positioning the heat plate in a second direction.

6. The electrical connector assembly as claimed in claim 5, wherein the retention section includes third tabs formed by part of the sidewall, and wherein the third tabs are located at the other pair of sides of the heat plate for positioning the heat plate in a third direction.

7. An electrical connector assembly comprising:
an electrical connector for establishing electrical connection between an electrical package and a printed circuit board; and
a heat dissipate device disposed upon the electrical connector and comprising a heat plate pressing the electrical package, a heat pipe secured on the heat plate and a load plate positioning on the printed circuit board, the load plate including a plate portion and a pair of sidewalls extending upwardly from the plate portion; wherein
the heat plate is attached to the load plate when pull the sidewalls of the load plate outwardly and secured on the load plate after release.

8. The electrical connector assembly as claimed in claim 7, wherein the heat plate comprises a plate portion and a pair of wing portions bending downwardly from the plate portion.

9. The electrical connector assembly as claimed in claim 8, wherein the heat pipe is soldered on the heat plate and the heat pipe is supported on the load plate.

10. The electrical connector assembly as claimed in claim 8, wherein the load plate comprises a pair of wing portion bending downwardly from opposite sides of the plate portion; and an opening on the plate portion for accommodating the heat plate.

11. The electrical connector assembly as claimed in claim 10, wherein the sidewall includes first, second and third tabs for positioning the heat plate in three directions, respectively.

12. An electrical connector assembly comprising:
an electrical connector;
an electronic package mounted upon the connector and having a raised center section and a lower periphery section; and
a heat dissipation device positioned upon the electronic package, and including a heat pipe and a heat plate pre-assembled with each other with an thermal interface therebetween, and a load plate defining a center opening, about which the thermal interface is located and via which at least one of said heat pipe and said heat plate extends for approaching the other; wherein
in a final assembled stage, the heat plate and the load plate are vertically engaged with each other on a periphery area in an overlapped manner under condition of the heat pipe and the heat plate cooperating with each other to analogously vertically sandwich the load plate therebetween wherein the heat pipe downwardly confronts a portion of the load plate while the heat plate upwardly confronts another portion of the load plate for preventing the pre-assembled heat plate and heat pipe from being withdrawn from the load plate; wherein
at least one of said load plate and said heat plate is recoverably deflectable about said periphery area to change said overlapped manner to a non-overlapped manner so as to allow the heat plate with the preassembled heat pipe to be successively assembled with the load plate without interference for reaching said final assembled stage.

13. The electrical connector assembly as claimed in claim 12, wherein said heat plate contacts at least one of said raised center section and said lower periphery section of the electronic package.

14. The electrical connector assembly as claimed in claim 12, wherein the load plate is recoverably deflectable.

15. The electrical connector assembly as claimed in claim 14, wherein said load plate defines a deflectable side wall with thereof a retention tab for vertical engagement with the heat plate.

16. The electrical connector assembly as claimed in claim 15, wherein said load plate further includes another tab for horizontal engagement with the heat plate.

17. The electrical connector assembly as claimed in claim 12, wherein said heat plate extends through the center opening of the load plate to touch the heat pipe.

18. The electrical connector assembly as claimed in claim 12, further including a printed circuit board on which the connector is mounted, wherein the load plate is fastened to the printed circuit board so as to impose a downward force upon the electronic package.

19. The electrical connector assembly as claimed in claim 18, wherein the heat plate upwardly intimately abuts against said another portion of the load plate.

20. The electrical connector assembly as claim 12, wherein said heat pipe is downwardly intimately seated upon said portion of the load plate.

* * * * *